(12) United States Patent
Kim et al.

(10) Patent No.: US 12,272,695 B2
(45) Date of Patent: Apr. 8, 2025

(54) SEMICONDUCTOR DEVICE

(71) Applicant: SAMSUNG ELECTRONICS CO., LTD., Suwon-si (KR)

(72) Inventors: Sungmin Kim, Seongnam-si (KR); Yeonsook Kim, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 450 days.

(21) Appl. No.: 17/702,408

(22) Filed: Mar. 23, 2022

(65) Prior Publication Data

US 2023/0005960 A1 Jan. 5, 2023

(30) Foreign Application Priority Data

Jul. 5, 2021 (KR) .......................... 10-2021-0087602

(51) Int. Cl.
*H01L 27/12* (2006.01)
*H01L 29/06* (2006.01)
*H01L 29/423* (2006.01)
*H01L 29/786* (2006.01)

(52) U.S. Cl.
CPC ...... *H01L 27/1203* (2013.01); *H01L 29/0665* (2013.01); *H01L 29/42392* (2013.01); *H01L 29/78696* (2013.01)

(58) Field of Classification Search
None
See application file for complete search history.

(56) References Cited

U.S. PATENT DOCUMENTS

| | | | |
|---|---|---|---|
| 6,768,175 B1 | 7/2004 | Morishita et al. | |
| 7,655,327 B2 | 2/2010 | Atanackovic | |
| 8,835,955 B2 | 9/2014 | Arkun et al. | |
| 9,406,748 B1 * | 8/2016 | Balakrishnan | .... H01L 29/66439 |
| 9,698,235 B2 | 7/2017 | Migita et al. | |
| 2006/0094202 A1 | 5/2006 | Bromberger | |
| 2023/0170352 A1 * | 6/2023 | Bao | ................... H01L 29/78696 257/351 |

FOREIGN PATENT DOCUMENTS

| | | |
|---|---|---|
| CN | 1535472 A | 10/2004 |
| CN | 103839947 A | 6/2014 |
| EP | 0371720 B1 | 8/1995 |
| JP | S61274328 A | 12/1986 |
| JP | S629623 A | 1/1987 |
| JP | H0697401 A | 4/1994 |
| JP | H0722313 A | 1/1995 |
| JP | H10144607 A | 5/1998 |

(Continued)

OTHER PUBLICATIONS

Lee, Seung Min , et al., "Advanced Silicon-on-Insulator: Crystalline Silicon on Atomic Layer Deposited Beryllium Oxide", Scientific Reports, 7:13205, Oct. 16, 2017, 7 pp.

*Primary Examiner* — Anthony Ho
(74) *Attorney, Agent, or Firm* — Myers Bigel, P.A.

(57) ABSTRACT

A semiconductor device is provided that includes a base substrate, an insulating film on the base substrate, and an upper substrate on the insulating film. The insulating film includes a crystalline insulating material. A thickness of the insulating film is about 1 nm to about 1,000 nm, and a thickness of the upper substrate is about 1 nm to about 100 nm.

18 Claims, 24 Drawing Sheets

(56) References Cited

FOREIGN PATENT DOCUMENTS

| | | |
|---|---|---|
| JP | 2005527097 A | 9/2005 |
| JP | 5692801 B2 | 2/2015 |
| WO | 03009357 A2 | 1/2003 |
| WO | 2009052486 A1 | 4/2009 |
| WO | 2020180940 A1 | 9/2020 |

* cited by examiner

SEMICONDUCTOR DEVICE

CROSS-REFERENCE TO RELATED APPLICATION

This application claims priority from Korean Patent Application No. 10-2021-0087602 filed on Jul. 5, 2021 in the Korean Intellectual Property Office, and all the benefits accruing therefrom under 35 U.S.C. 119, the contents of which in its entirety are herein incorporated by reference.

BACKGROUND

1. Field of the Invention

The present invention relates to a semiconductor device.

2. Description of the Related Art

In order to meet performance and price requirements of consumers, it may be required to increase the degree of integration of semiconductor elements. Because the degree of integration may be an important factor in determining the price of a product, increased density may be required.

As a result of process miniaturization of semiconductor elements, the influence of element bottom leakage current has become significant. As such, SOI (silicon on insulator) wafers have become an alternative.

Conventionally, two SOI wafers are consumed at the time of fabrication, and the fabricating cost may be large due to a complicated process. As a result, an attempt to form an SOI structure through hetero epitaxial growth has been proposed.

SUMMARY

Aspects of the present invention provide a semiconductor device in which stability is improved and electrical characteristics are improved.

According to some aspects of the present inventive concept, there is provided a semiconductor device comprising a base substrate, an insulating film on the base substrate, and an upper substrate on the insulating film, wherein the insulating film includes a crystalline insulating material. A thickness of the insulating film is from about 1 nm to about 1,000 nm, and a thickness of the upper substrate is from about 1 nm to about 100 nm.

According to some aspects of the present inventive concept, there is provided a semiconductor device comprising a base substrate, a first insulating film on the base substrate, a first upper substrate on the first insulating film, a second insulating film on the first upper substrate, and a second upper substrate on the second insulating film. The first insulating film and the second insulating film include a crystalline insulating material, a thickness of each of the first insulating film and the second insulating film is from about 1 nm to about 1,000 nm, and a thickness of each of the first upper substrate and the second upper substrate is from about 1 nm to about 100 nm.

According to some aspects of the present inventive concept, there is provided a semiconductor device comprising a substrate which includes a lower substrate, and a lower pattern extending in a first direction on the lower substrate, a first insulating film in the substrate, a sheet pattern on the lower pattern and spaced apart from the lower pattern, a gate electrode on the lower pattern, which extends in a second direction different from the first direction and wraps the sheet pattern, wherein the first insulating film includes a crystalline insulating material, a thickness of the first insulating film is from about 1 nm to about 1,000 nm, and a thickness of the lower pattern is from about 1 nm to about 100 nm.

However, aspects of the present invention are not restricted to the one set forth herein. The and other aspects of the present invention will become more apparent to one of ordinary skill in the art to which the present invention pertains by referencing the detailed description of the present invention given below.

DETAILED DESCRIPTION OF THE EMBODIMENTS

Figure 1:
FIGS. 1 to 3 are intermediate stage diagrams for explaining a method of fabricating a semiconductor device according to some embodiments.

Hereinafter, embodiments of the present invention will be described in detail referring to the accompanying drawings. The same components on the drawings are denoted by the same reference numerals, and repeated descriptions thereof will not be provided.

Figure 2:
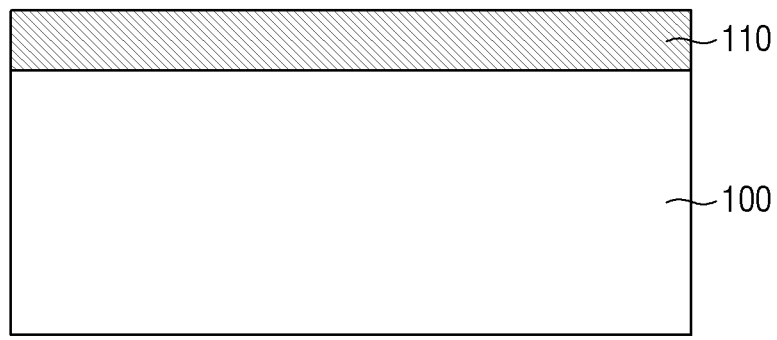
Figure 3:
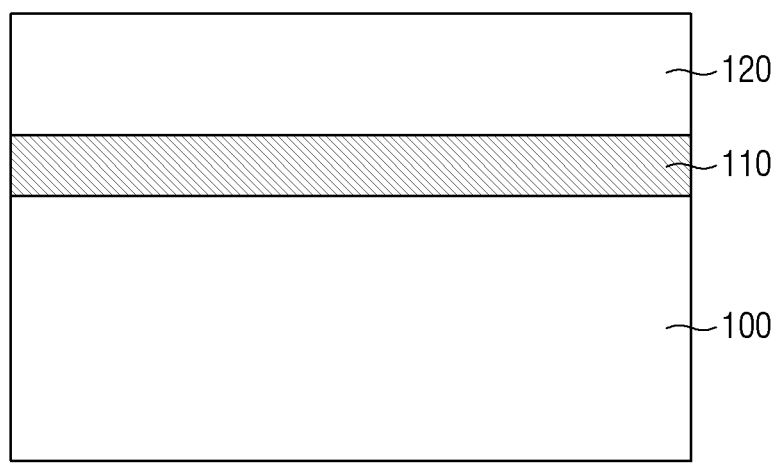
Figure 4:
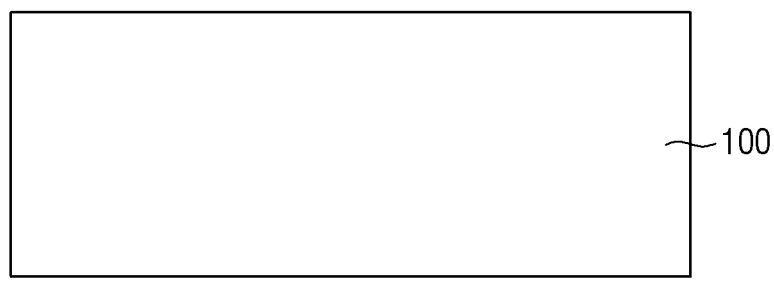
FIGS. 4 to 7 are intermediate stage diagrams for explaining the method for fabricating the semiconductor device according to some embodiments.
Figure 5:
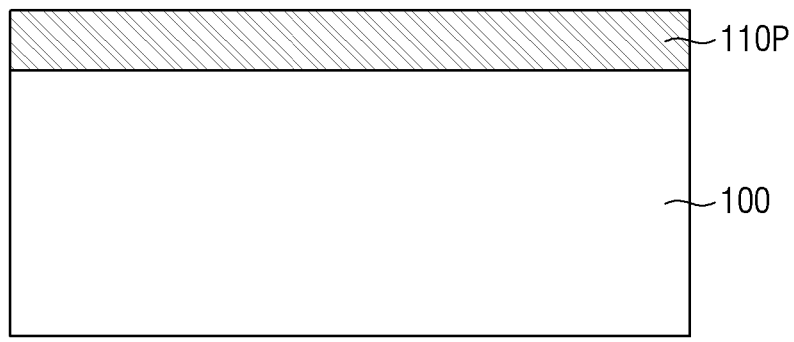
Figure 6:
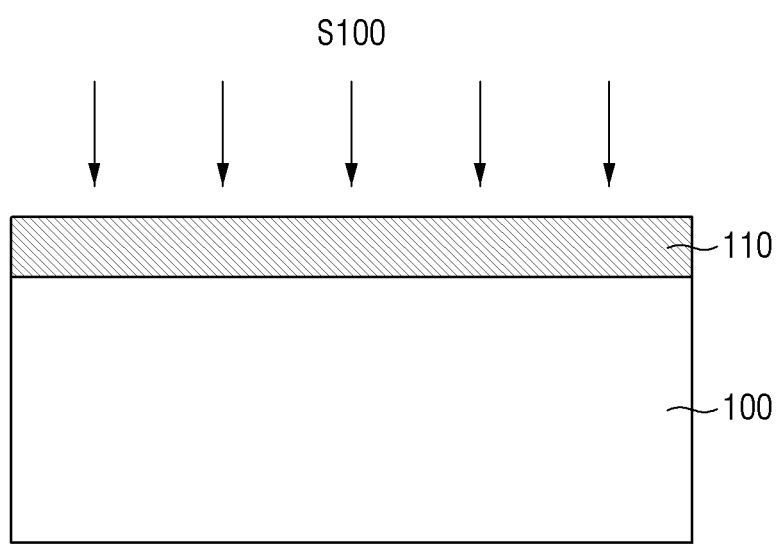
Figure 7:
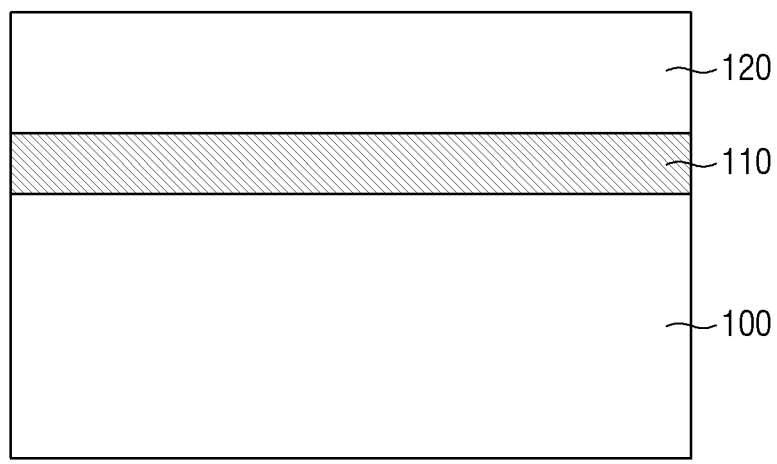

FIGS. 1 to 3 are intermediate stage diagrams for explaining a method of fabricating a semiconductor device according to some embodiments.

Referring to FIGS. 1 to 3, a base substrate 100 may be provided.

The base substrate 100 may include a semiconductor material. For example, the base substrate 100 may include silicon (Si).

An upper side of the base substrate 100 may have a (100) crystal plane.

A first insulating film 110 may be formed on the base substrate 100. The first insulating film 110 may be formed on the (100) crystal plane of the base substrate 100. The first insulating film 110 may extend along the upper side of the base substrate 100. The first insulating film 110 may come into contact with the upper side of the base substrate 100.

The first insulating film 110 may include a crystalline insulating material.

The crystalline insulating material may have a small lattice mismatch with the base substrate 100. The crystalline insulating material may be a material that exhibits suitable electrical insulation and interfacial stability.

Specifically, the crystalline insulating material may be a material in which a bandgap energy of 4.0 eV or higher is calculated. The bandgap energy of the crystalline insulating material may be calculated, using DFT (Density Functional Theory) that utilizes HSE (Heyd-Scuseria-Ernzerhof), GGA (Generalized Gradient Approximation), and the like. Alternatively, the bandgap energy of the crystalline insulating material may be determined through an optical measurement method.

For example, the first insulating film 110 may include at least one of fluoride, oxide and oxyfluoride.

Specifically, fluoride may include at least one of aluminum fluoride ($AlF_x$; where x is a positive integer of 3 or less), calcium fluoride ($CaF_x$; where x is a positive integer of 2 or less), strontium fluoride ($SrF_x$; where x is a positive integer of 2 or less), yttrium fluoride ($YF_x$; where x is a positive integer of 3 or less), and zirconium fluoride ($ZrF_x$; where x is a positive integer of 4 or less).

Oxides may include at least one of aluminum oxide ($Al_2O_x$, where x is a positive integer of 3 or less), beryllium oxide ($BeO_x$; where x is a positive integer of 1 or less), calcium zirconium oxide ($Ca_xZr_{(1-x)}O_y$; where x is a positive integer greater of 0 or more and 1 or less, and y is a positive integer of 2 or less), hafnium oxide ($HfO_x$; where x is a positive integer of 2 or less), and yttrium oxide ($Y_2O_x$; where x is a positive integer of 3 or less).

Oxyfluoride may include at least one of lanthanum oxyfluoride ($LaO_xF_y$; where x is a positive integer of 1 or less, and y is a positive integer of 1 or less), lutetium oxyfluoride ($LuO_xF_y$; where x is a positive integer of 1 or less, and y is a positive integer of 1 or less), and yttrium oxyfluoride ($YO_xF_y$; where x is a positive integer of 1 or less, and y is a positive integer of 1 or less).

A thickness of the first insulating film 110 may be from about 1 nm to about 1,000 nm.

A crystalline insulating material may be deposited on the first insulating film 110 through a physical vapor deposition method or a chemical vapor deposition method.

However, the method for forming the first insulating film 110 is merely an example, and the technical idea of the present invention is not limited thereto. For example, the first insulating film 110 may be physically deposited through a MBE (molecular beam epitaxy) vapor deposition method. As another example, the first insulating film 110 may be chemically deposited through a chemical vapor deposition (CVD) method.

A difference between a lattice constant of the semiconductor material of the base substrate 100 and a lattice constant of the crystalline insulating material of the first insulating film 110 may be smaller than 7%. A detailed description of the difference between the lattice constant of the semiconductor material of the base substrate 100 and the lattice constant of the crystalline insulating material of the first insulating film 110 will be provided below, using FIG. 24.

A first upper substrate 120 may be formed on the first insulating film 110. The first upper substrate 120 may extend along the upper side of the first insulating film 110. The first upper substrate 120 may come into contact with the upper side of the first insulating film 110.

The first upper substrate 120 may include a semiconductor material. For example, the first upper substrate 120 may include silicon (Si).

The thickness of the first upper substrate 120 may be from about 1 nm to about 100 nm.

The base substrate 100 and the first insulating film 110 may come into contact with each other, and the first insulating film 110 and the first upper substrate 120 may come into contact with each other. That is, a mixed layer may not be formed between the base substrate 100 and the first insulating film 110, and between the first insulating film 110 and the first upper substrate 120, due to a difference in reactivity between the membranes.

FIGS. 4 to 7 are intermediate stage diagrams for explaining the method for fabricating the semiconductor device according to some embodiments.

For convenience of explanation, points different from those described using FIGS. 1 to 3 will be mainly described.

Referring to FIGS. 4 to 7, the base substrate 100 may be provided.

An amorphous layer 110*p* may be deposited on the base substrate 100. After that, the amorphous layer 110*p* may be crystallized through a subsequent heat treatment (S100), thereby forming the first insulating film 110.

The subsequent heat treatment (S100) may include annealing at a high temperature. However, this is only an example, and the technical idea of the present invention is not limited thereto. For example, the subsequent heat treatment (S100) may be performed, using ultraviolet light (UV).

After that, the first upper substrate 120 may be formed on the first insulating film 110.

Figure 8:
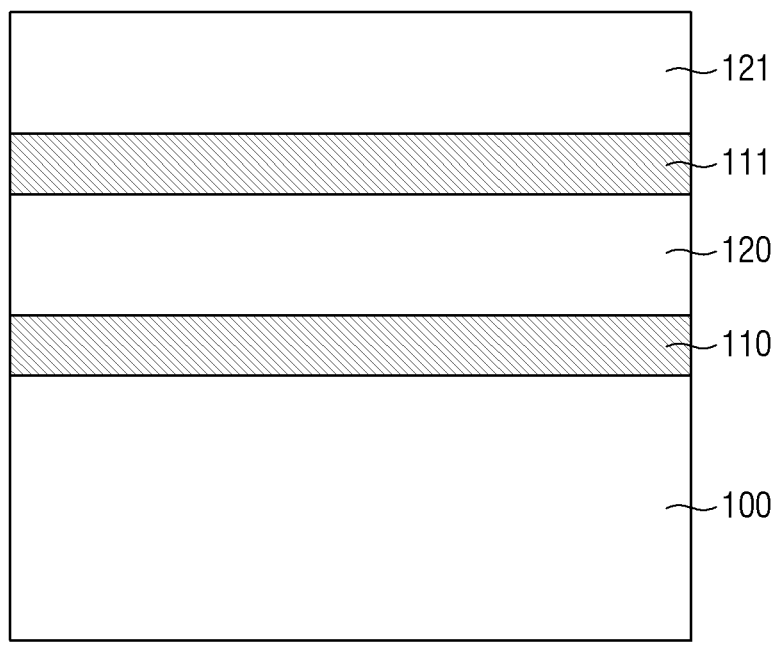
FIG. 8 is a diagram for explaining the semiconductor device according to some embodiments.

FIG. 8 is a diagram for explaining the semiconductor device according to some embodiments. For convenience of explanation, repeated parts of contents explained using FIGS. 1 to 7 will be simplified or omitted.

Referring to FIG. 8, the semiconductor device according to some embodiments may include the base substrate 100, and the first insulating film 110, the first upper substrate 120, the second insulating film 111 and the second upper substrate 121 which are sequentially stacked on the base substrate 100, as illustrated.

The first insulating film 110 may be formed on the base substrate 100. The first insulating film 110 may extend along the upper side of the base substrate 100. The first insulating film 110 may come into contact with the upper side of the base substrate 100.

The first insulating film 110 may include a crystalline insulating material. For example, the first insulating film 110 may include at least one of fluoride, oxide and oxyfluoride.

A thickness of the first insulating film 110 may be from about 1 nm to about 1,000 nm.

A difference between the lattice constant of the semiconductor material of the base substrate 100 and the lattice constant of the crystalline insulating material of the first insulating film 110 may be smaller than 7%.

The first upper substrate 120 may be formed on the first insulating film 110. The first upper substrate 120 may extend along the upper side of the first insulating film 110. The first upper substrate 120 may come into contact with the upper side of the first insulating film 110.

The first upper substrate 120 may include a semiconductor material. For example, the first upper substrate 120 may include silicon (Si).

The thickness of the first upper substrate 120 may be from about 1 nm to about 100 nm.

The second insulating film 111 may be formed on the first upper substrate 120. The second insulating film 111 may extend along the upper side of the first upper substrate 120. The second insulating film 111 may come into contact with the upper side of the first upper substrate 120.

The second insulating film 111 may include a crystalline insulating material. For example, the second insulating film 111 may include at least one of fluoride, oxide and oxyfluoride.

The thickness of the second insulating film 111 may be from about 1 nm to about 1,000 nm.

A difference between the lattice constant of the semiconductor material of the first upper substrate 120 and the lattice constant of the crystalline insulating material of the second insulating film 111 may be smaller than 7%.

The second upper substrate 121 may be formed on the second insulating film 111. The second upper substrate 121 may extend along the upper side of the second insulating film 111. The second upper substrate 121 may come into contact with the upper side of the second insulating film 111.

The second upper substrate 121 may include a semiconductor material. For example, the second upper substrate 121 may include silicon (Si).

The thickness of the second upper substrate 121 may be from about 1 nm to about 100 nm.

Figure 9:
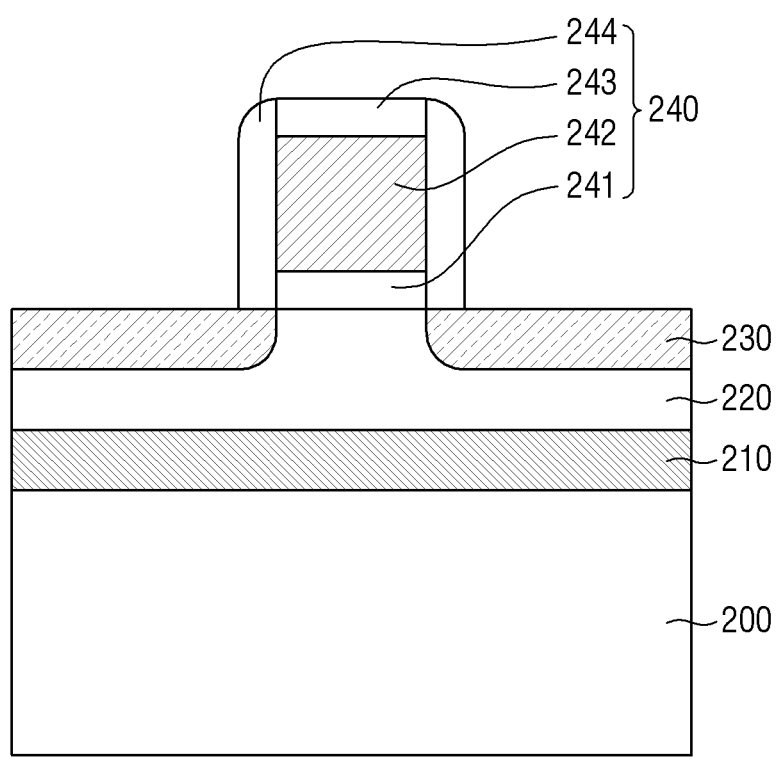
FIGS. 9 to 11 are diagrams for explaining a semiconductor device according to some embodiments.
Figure 10:
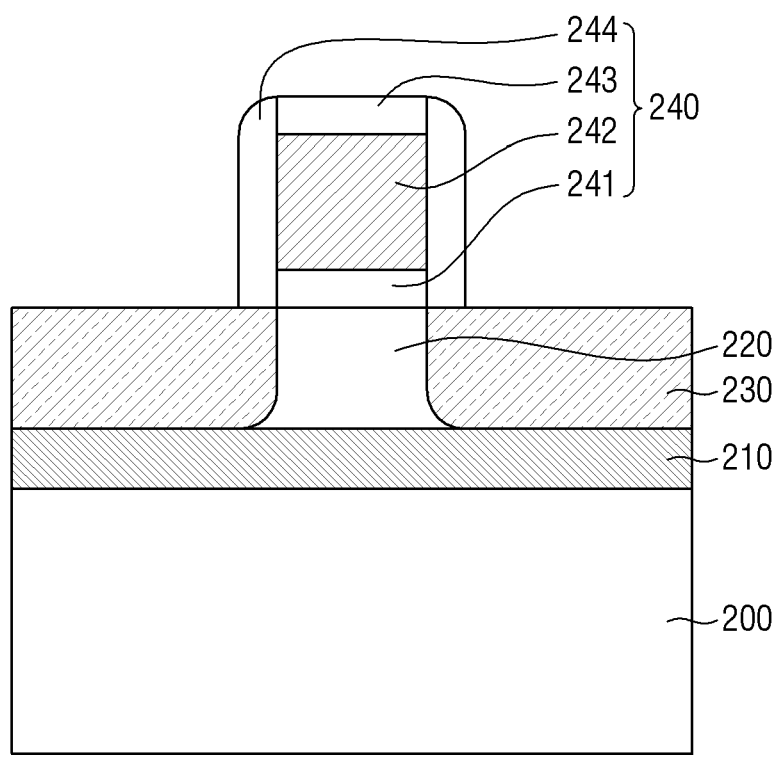
Figure 11:
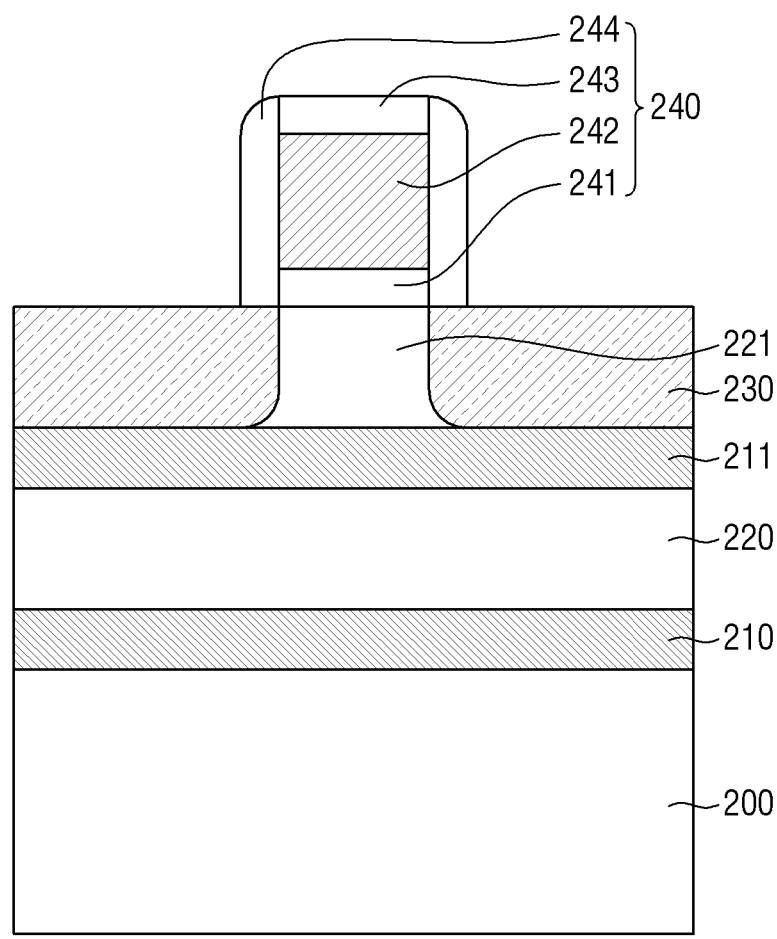

FIGS. 9 to 11 are diagrams for explaining a semiconductor device according to some embodiments.

For convenience of explanation, points different from those described using FIGS. 1 to 3 will be mainly described.

Referring to FIG. 9, the semiconductor device according to some embodiments may further include a gate structure 240 and a source/drain region 230.

The gate structure 240 may be placed on the base substrate 200, the first insulating film 210 and the first upper substrate 220. The gate structure 240 may include a gate insulating film 241, a gate electrode 242, a gate capping film 243, and a gate spacer 244.

The gate insulating film 241 may be formed on the first upper substrate 220. The gate insulating film 241 may extend along the upper side of the first upper substrate 220. The gate insulating film 241 may extend along a lower side of the gate electrode 242.

The shape of the gate insulating film 241 is merely an example, and the technical idea of the present invention is not limited thereto. For example, the gate insulating film 241 may extend along the side walls and a bottom face of the gate electrode 242.

Although the gate insulating film 241 is shown as a single layer, this is only an example, and the technical idea of the present invention is not limited thereto. For example, the gate insulating film 241 may have a multilayer structure.

The gate insulating film 241 may include silicon oxide, silicon oxynitride, silicon nitride or a high dielectric constant material having a higher dielectric constant than silicon oxide.

The gate electrode 242 may be formed on the first upper substrate 220. Specifically, the gate electrode 242 may be formed on the gate insulating film 241.

The gate electrode 242 may include a conductive material. For example, the gate electrode 242 may include, but is not limited to, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and combinations thereof.

The gate capping film 243 may be placed on the gate electrode 242. The gate capping film 243 may be placed between the gate spacers 244.

However, the arrangement of the gate capping film 243 is merely an example, and the technical idea of the present invention is not limited thereto. For example, the gate capping film 243 may be placed on the gate electrode 242 and the gate spacer 244.

The gate capping film 243 may include at least one of silicon nitride (SiN), silicon oxynitride (SiON), silicon oxide (SiO$_2$), silicon carbonitride (SiCN), silicon oxycarbonitride (SiOCN), and combinations thereof.

The gate spacer 244 may be placed on the side walls of the gate insulating film 241, the gate electrode 242 and the gate capping film 243. A pair of gate spacers 244 may wrap both side walls of the gate insulating film 241, the gate electrode 242 and the gate capping film 243.

The gate spacer 244 may include, for example, at least one of silicon nitride (SiN), silicon oxynitride (SiON), silicon oxide (SiO$_2$), silicon oxycarbonitride (SiOCN), silicon boronitride (SiBN), silicon oxyboronitride (SiOBN), silicon oxycarbide (SiOC), and combinations thereof.

The source/drain region 230 may be formed in the first upper substrate 220. The source/drain region 230 may be formed in the first upper substrate 220 exposed by the gate structure 240. Specifically, the source/drain region 230 may be formed in the first upper substrate 220 exposed by the gate electrode 242, as illustrated in FIG. 9.

However, the arrangement of the source/drain region 230 is merely an example, and the technical idea of the present invention is not limited thereto. For example, unlike that shown in FIG. 9, the source/drain region 230 may be formed in the first upper substrate 220 exposed by the gate electrode 242 and the gate spacer 244, as illustrated in FIG. 10.

The source/drain region 230 may include p-type impurities or n-type impurities.

Referring back to FIG. 9, the source/drain region 230 may not be in contact with the first insulating film 210. That is, the semiconductor device according to some embodiments may have a partially depleted silicon on insulator (PDSOI) structure.

However, this is only an example, and the technical idea of the present invention is not limited thereto. For example, as shown in FIG. 10, the source/drain region 230 may come into contact with the first insulating film 210. That is, the semiconductor device according to some embodiments may have a fully depleted silicon on insulator (FDSOI) structure.

For reference, FIG. 11 shows an example of a semiconductor device including the SOI structure of FIG. 8. For convenience of explanation, repeated parts of contents explained using FIGS. 8 and 10 will be simplified or omitted.

Referring to FIG. 11, the semiconductor device according to some embodiments may further include a second insulating film 211 and a second upper substrate 221.

The second insulating film 211 and the second upper substrate 221 may be sequentially stacked on the first upper substrate 220, as illustrated.

The source/drain region 230 may be formed in the second upper substrate 221. The source/drain region 230 may be formed in the second upper substrate 221 exposed by the gate structure 240. Specifically, the source/drain region 230 may be formed in the second upper substrate 221 exposed by the gate electrode 242, as illustrated in FIG. 11.

The source/drain region 230 may come into contact with the second insulating film 211. That is, the semiconductor device according to some embodiments may have a fully depleted silicon on insulator (FDSOI) structure.

However, this is only an example, and the technical idea of the present invention is not limited thereto. For example, although not shown, the source/drain region 230 may not be in contact with the second insulating film 211. That is, the semiconductor device according to some embodiments may have a partially depleted silicon on insulator (PDSOI) structure.

Figure 12:
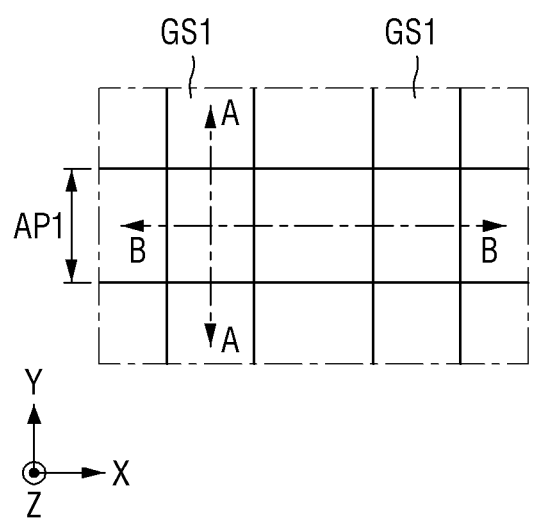
FIG. 12 is a layout diagram for explaining a semiconductor device according to some embodiments.
Figure 13:
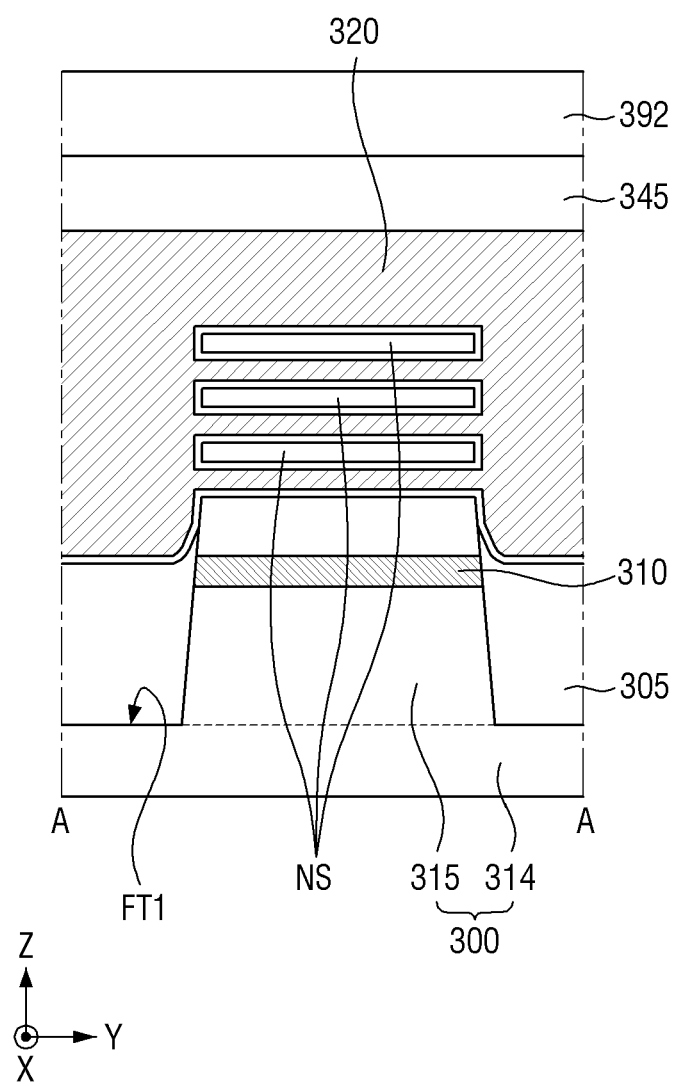
FIGS. 13 and 14 are exemplary cross-sectional views for explaining a semiconductor device according to some embodiments, taken along A-A and B-B of FIG. 12, respectively.
Figure 14:
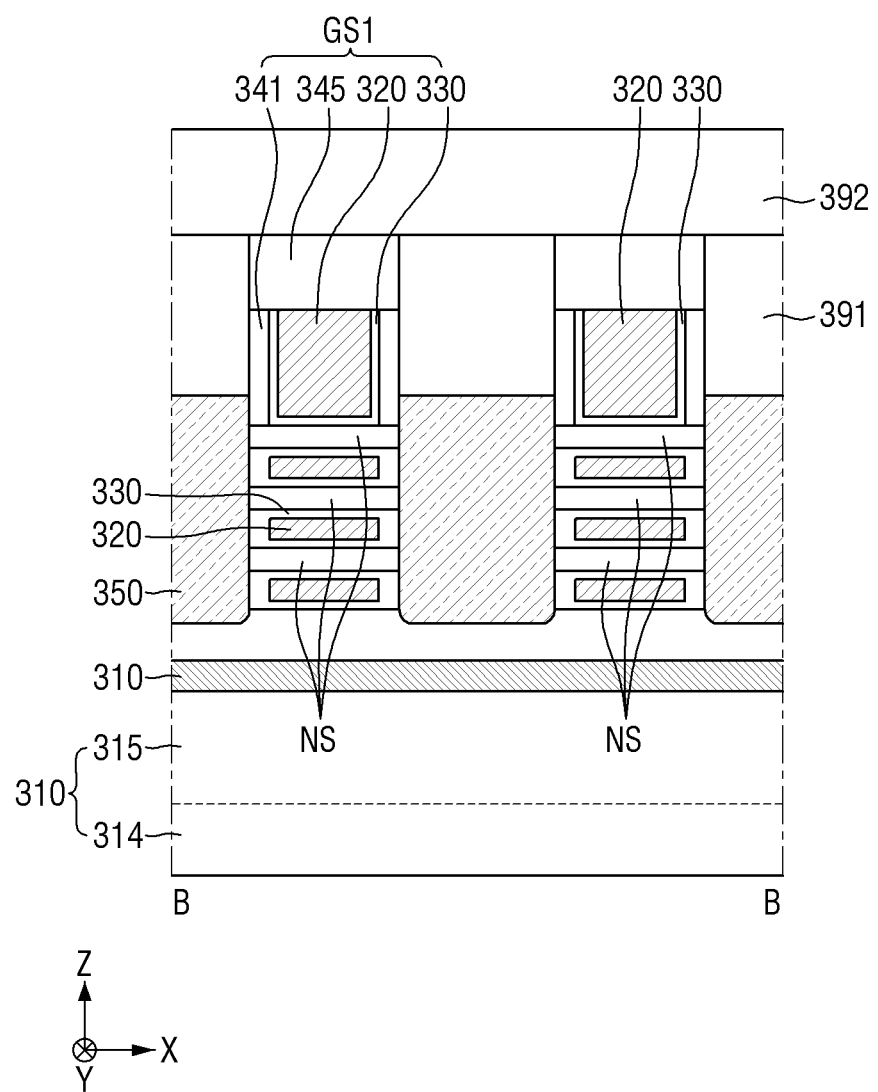
Figure 15:
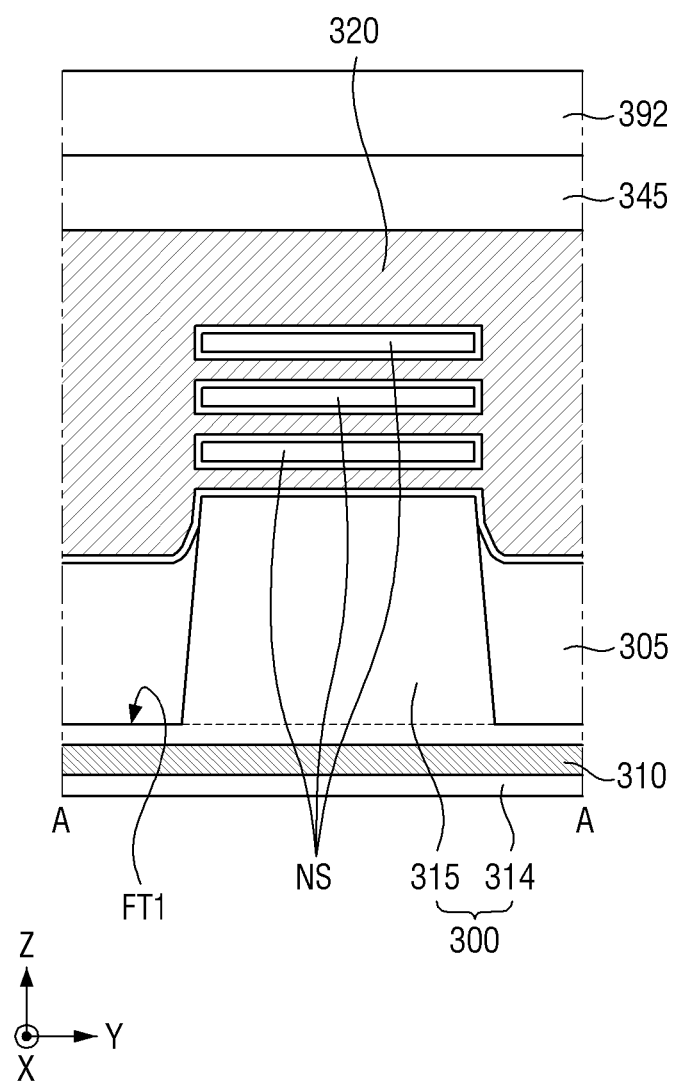
FIGS. 15 to 17 are exemplary cross-sectional views for explaining a semiconductor device according to some embodiments.
Figure 16:
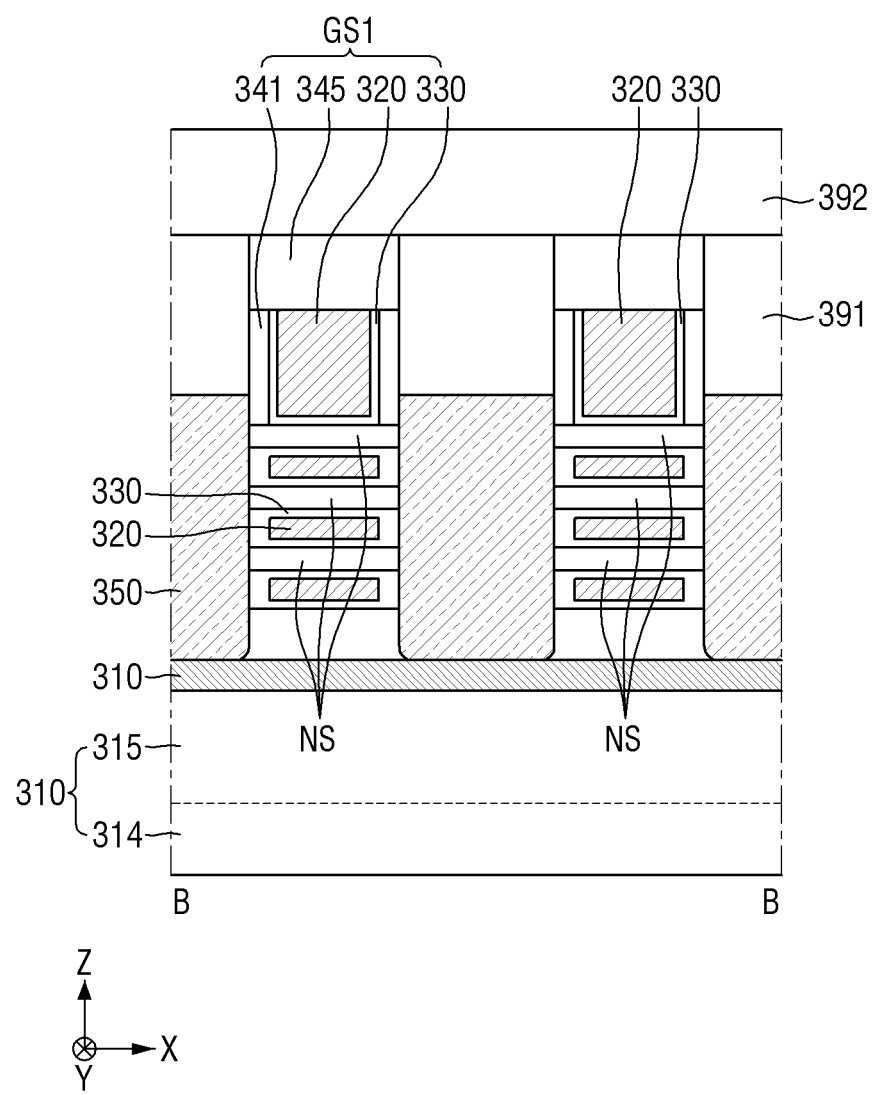
Figure 17:
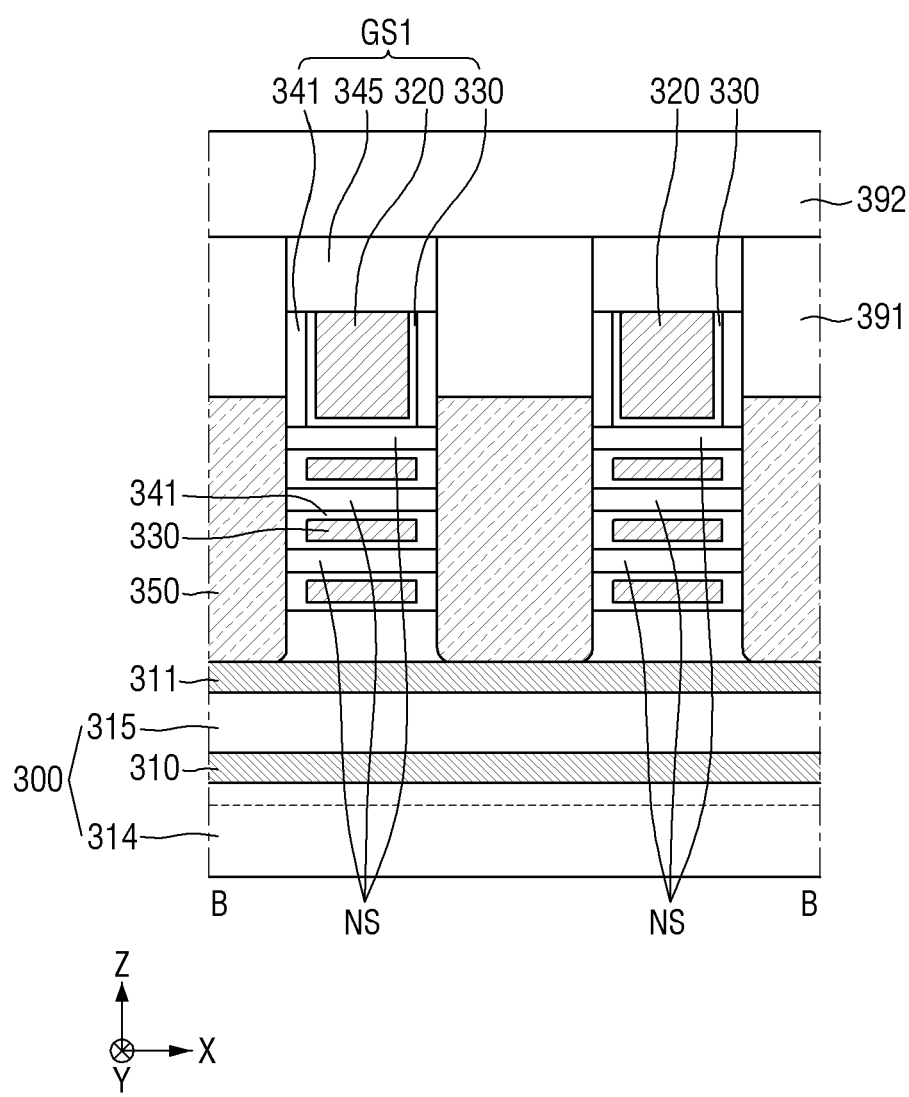

FIG. 12 is a layout diagram for explaining a semiconductor device according to some embodiments. FIGS. 13 and 14 are exemplary cross-sectional views for explaining a semiconductor device according to some embodiments, taken along A-A and B-B of FIG. 12, respectively. FIGS. 15 to 17 are exemplary cross-sectional views for explaining a semiconductor device according to some embodiments.

For reference, FIG. 15 is a cross-sectional view taken along A-A of FIG. 12, and FIGS. 16 and 17 are cross-sectional views taken along B-B of FIG. 12.

Referring to FIGS. 12 to 17, the semiconductor devices according to some embodiments may include a substrate 300, a first insulating film 310, an active pattern AP1, a plurality of gate structures GS1, and an epitaxial pattern 350.

The substrate 300 may include a low-voltage operating region and a high-voltage operating region. More specifically, the low-voltage operating region may include, for example, but is not limited to, a logic region or an SRAM region. The high-voltage operating region may include, for example, but is not limited to, a I/O region.

The substrate 300 may be SOI (silicon-on-insulator). The substrate 300 may include a semiconductor material.

For example, the substrate 300 may include silicon (Si). The upper side of the substrate 300 may have a (100) crystal plane.

The substrate 300 may include a lower substrate 314 and a lower pattern 315.

The lower substrate 314 may be in the form of a plate extending in a first direction X and a second direction Y.

The lower pattern 315 may be formed on the lower substrate 314. The lower pattern 315 may extend in the first direction X. The lower pattern 315 may be spaced in the second direction Y. The lower pattern 315 may protrude from the upper side of the lower substrate 314.

The lower pattern 315 may be separated by a fin trench FT1 extending in the first direction X.

The lower pattern 315 may include side walls that are opposite to each other. The side walls of the lower pattern 315 may extend in the first direction X. The side walls of the lower pattern 315 may be defined by the fin trench FT1.

The thickness of the lower pattern 315 may be from about 1 nm to about 100 nm.

The first insulating film 310 may be in the substrate 300. The first insulating film 310 may correspond to the first insulating film 110 of FIG. 3.

The first insulating film 310 may include a crystalline insulating material. For example, the first insulating film 310 may include at least one of fluoride, oxide and oxyfluoride.

Specifically, fluoride may include at least one of aluminum fluoride ($AlF_x$; where x is a positive integer of 3 or less), calcium fluoride ($CaF_x$; where x is a positive integer of 2 or less), strontium fluoride ($SrF_x$; where x is a positive integer of 2 or less), yttrium fluoride ($YF_x$; where x is a positive integer of 3 or less), and zirconium fluoride ($ZrF_x$; where x is a positive integer of 4 or less).

Oxides may include at least one of aluminum oxide ($Al_2O_x$, where x is a positive integer of 3 or less), beryllium oxide ($BeO_x$; where x is a positive integer of 1 or less), calcium zirconium oxide ($Ca_xZr_{(1-x)}O_y$; where x is a positive integer greater of 0 or more and 1 or less, and y is a positive integer of 2 or less), hafnium oxide ($HfO_x$; where x is a positive integer of 2 or less), and yttrium oxide ($Y_2O_x$; where x is a positive integer of 3 or less).

Oxyfluoride may include at least one of lanthanum oxyfluoride ($LaO_xF_y$; where x is a positive integer of 1 or less, and y is a positive integer of 1 or less), lutetium oxyfluoride ($LuO_xF_y$; where x is a positive integer of 1 or less, and y is a positive integer of 1 or less), and yttrium oxyfluoride ($YO_xF_y$; where x is a positive integer of 1 or less and y is a positive integer of 1 or less).

A thickness of the first insulating film 310 may be from about 1 nm to about 1,000 nm.

A difference between the lattice constant of the semiconductor material of the substrate 300 and the lattice constant of the crystalline insulating material of the first insulating film 310 may be smaller than 7%.

The lower pattern 315 may be placed on the first insulating film 310.

Specifically, as shown in FIG. 13, the first insulating film 310 may be in the lower pattern 315. However, the arrangement of the first insulating film 310 is merely an example, and the technical idea of the present invention is not limited thereto.

For example, as shown in FIG. 15, the first insulating film 310 may be in the lower substrate 314 below the lower pattern 315. Accordingly, the first insulating film 310 may extend in the second direction Y.

Also, as shown in FIG. 14, the first insulating film 310 may not be in contact with the epitaxial pattern 350. That is, the semiconductor device according to some embodiments may have a partially depleted silicon on insulator (PDSOI) structure.

However, this is only an example, and the technical idea of the present invention is not limited thereto. For example, as shown in FIG. 16, the first insulating film 310 may come into contact with the epitaxial pattern 350. That is, the semiconductor device according to some embodiments may have a fully depleted silicon on insulator (FDSOI) structure.

Although the number of first insulating films 310 is shown as one through FIGS. 13 to 16, this is only an example, and the technical idea of the present invention is not limited thereto.

For example, as shown in FIG. 17, the semiconductor device according to some embodiments may further include a second insulating film 311.

The second insulating film 311 may be in the substrate 300. The second insulating film 311 may be placed to be spaced apart from the first insulating film 310.

The second insulating film 311 may correspond to the second insulating film 111 shown in FIG. 8.

The second insulating film 311 may include a crystalline insulating material. For example, the second insulating film 311 may include at least one of fluoride, oxide and oxyfluoride.

The thickness of the second insulating film 311 may be from about 1 nm to about 1,000 nm.

The second insulating film 311 may come into contact with the epitaxial pattern 350. That is, the semiconductor device according to some embodiments may have a fully depleted silicon on insulator (FDSOI) structure.

However, this is only an example, and the technical idea of the present invention is not limited thereto. For example, although not shown, the second insulating film 311 may, of course, not be in contact with the epitaxial pattern 350.

The active pattern AP1 may be placed on the substrate 300. The active pattern AP1 may extend long in the first direction X. Although not shown, the active pattern AP1 may be spaced in a second direction Y that intersects the first direction X.

As an example, the active pattern AP1 may be a region in which an NMOS is formed, and as another example, an active pattern AP1 may be a region in which a PMOS is formed.

The active pattern AP1 may include a plurality of sheet patterns NS.

The sheet pattern NS may be placed on the substrate 300. The sheet pattern NS may be placed to be spaced apart from the substrate 300.

The plurality of sheet patterns NS may be placed on the lower pattern 315. The plurality of sheet patterns NS may be spaced apart from the lower pattern 315 in a third direction Z that intersects the first direction X and the second direction Y. The plurality of sheet patterns NS may be spaced apart from each other in the third direction Z. The plurality of sheet patterns NS spaced apart from each other may be arranged in the first direction X along the upper side of the lower pattern 315.

The field insulating film 305 may be formed on the substrate 300. The field insulating film 305 may fill at least a part of the fin trench FT1.

The field insulating film 305 may wrap at least a part of the side walls of the lower pattern 315. The lower pattern 315 may be defined by the field insulating film 305.

The field insulating film 305 may include, for example, one of an oxide film, a nitride film, an oxynitride film or a combination thereof.

The plurality of gate structures GS1 may be placed on the substrate 300. Each gate structure GS1 may extend in the second direction Y. Adjacent gate structures GS1 may be spaced apart from each other in the first direction X.

The gate structure GS1 may be placed on the active pattern AP1. The gate structure GS1 may intersect the active pattern AP1. The gate structure GS1 may wrap the sheet pattern NS.

The gate structure GS1 may include, for example, a gate electrode 320, a gate insulating film 330, an outer spacer 341 and a gate capping pattern 345.

The plurality of gate electrodes 320 may be placed on the substrate 300. The gate electrode 320 may be placed on the lower pattern 315.

Each gate electrode 320 may extend in a second direction Y that intersects the first direction X. Each gate electrode 320 may be placed to be spaced apart in the first direction X.

The gate electrode 320 may be placed on a gate insulating film 330 to be described below. Each gate electrode 320 may intersect the active pattern AP1. Each gate electrode 320 may wrap each sheet pattern NS.

The gate electrode 320 may include at least one of a metal, a metal alloy, a conductive metal nitride, a metal silicide, a doped semiconductor material, a conductive metal oxide and a conductive metal oxynitride. The gate electrode 320 may include, for example, but is not limited to, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and combinations thereof. Conductive metal oxides and conductive metal oxynitrides may include, but are not limited to, oxidized forms of the above-mentioned materials.

Although the number of gate electrodes 320 is shown as two, this is only for convenience, and the number is not limited thereto. The number of gate electrodes 320 may be larger than or smaller than two.

The gate insulating film 330 may wrap around the sheet pattern NS.

The gate insulating film 330 may be placed on the substrate 300. The gate insulating film 330 may extend along the upper side of the lower pattern 315 and the upper side of the field insulating film 305. The gate insulating film 330 may wrap each sheet pattern NS. The gate insulating film 330 may wrap the gate electrode 320.

The gate insulating film 330 may be placed along the upper side of the sheet pattern NS located at the uppermost stage and the inner side wall of the outer spacer 341.

The gate insulating film 330 may include an insulating material, for example, a silicon oxide, silicon oxynitride, silicon nitride or a high dielectric constant material having a higher dielectric constant than silicon oxide.

The outer spacer 341 may be placed on the side walls of the gate electrode 320. The outer spacer 341 may extend in the second direction Y. A pair of outer spacers 341 may be formed on the side walls of the gate electrode 320.

The outer spacer 341 may include, for example, at least one of silicon nitride (SiN), silicon oxynitride (SiON), silicon oxide (SiO$_2$), silicon oxycarbonitride (SiOCN), silicon boronitride (SiBN), silicon oxyboronitride (SiOBN), silicon oxycarbide (SiOC), and combinations thereof.

Although not shown in FIGS. 12 to 17, a semiconductor device according to some embodiments may further include an inner spacer. This does not limit the technical idea of the present invention.

The inner spacer may extend along the side face of the gate insulating film 330. The inner spacer may be placed between the sheet patterns NS adjacent to each other in the third direction Z.

The inner spacer may include, for example, at least one of silicon nitride (SiN), silicon oxynitride (SiON), silicon oxide (SiO$_2$), silicon oxycarbonitride (SiOCN), silicon boronitride (SiBN), silicon oxyboronitride (SiOBN), silicon oxycarbide (SiOC), and combinations thereof.

The gate capping pattern 345 may be placed on the gate electrode 320, the gate insulating film 330 and the outer spacer 341.

The gate capping pattern 345 may include, for example, at least one of silicon nitride (SiN), silicon oxynitride (SiON), silicon oxide (SiO$_2$), silicon carbonitride (SiCN), silicon oxycarbonitride (SiOCN), and combinations thereof.

The plurality of epitaxial patterns 350 may be included in the source/drain of a transistor that uses the sheet pattern NS as a channel region.

The plurality of epitaxial patterns 350 may be placed on the lower pattern 315. The plurality of epitaxial patterns 350 may be placed between the gate electrodes 320 adjacent to each other in the first direction X. Each epitaxial pattern 350 may be connected to the sheet pattern NS adjacent in the first direction X. The epitaxial pattern 350 may be formed to be adjacent to one side face of the sheet pattern NS and the other side face of the sheet pattern NS.

Although not shown, a source/drain contact may be placed on the plurality of epitaxial patterns 350. Further, a metal silicide film may be further placed between the source/drain contact and the epitaxial pattern 350.

The first interlayer insulating film 391 may cover the outer spacer 341 and the side wall of the gate capping pattern 345. The first interlayer insulating film 391 may be placed on the epitaxial pattern 350.

The second interlayer insulating film 392 may be placed on the first interlayer insulating film 391 and the gate capping pattern 345.

The first interlayer insulating film 391 and the second interlayer insulating film 392 may include, for example, but are not limited to, FOX (Flowable Oxide), TOSZ (Tonen SilaZene), USG (Undoped Silica Glass), BSG (Borosilica Glass), PSG (PhosphoSilica Glass), BPSG (BoroPhospho-Silica Glass), PETEOS (Plasma Enhanced Tetra Ethyl Ortho Silicate), FSG (Fluoride Silicate Glass), CDO (Carbon Doped silicon Oxide), Xerogel, Aerogel, Amorphous Fluorinated Carbon, OSG (Organo Silicate Glass), Parylene, BCB (bis-benzocyclobutenes), SiLK, polyimide, porous polymeric material or a combination thereof.

Figure 18:
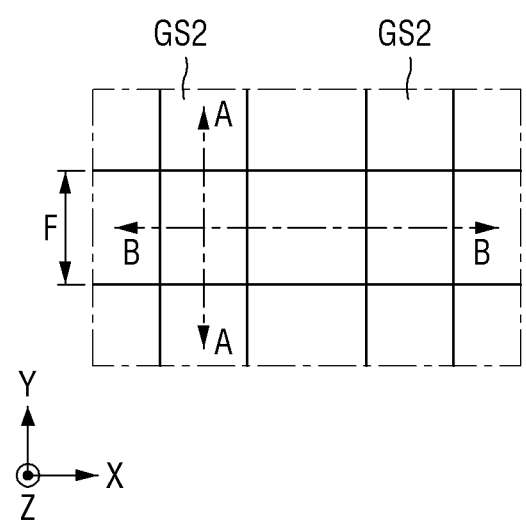
FIG. 18 is a layout diagram for explaining a semiconductor device according to some embodiments.
Figure 19:
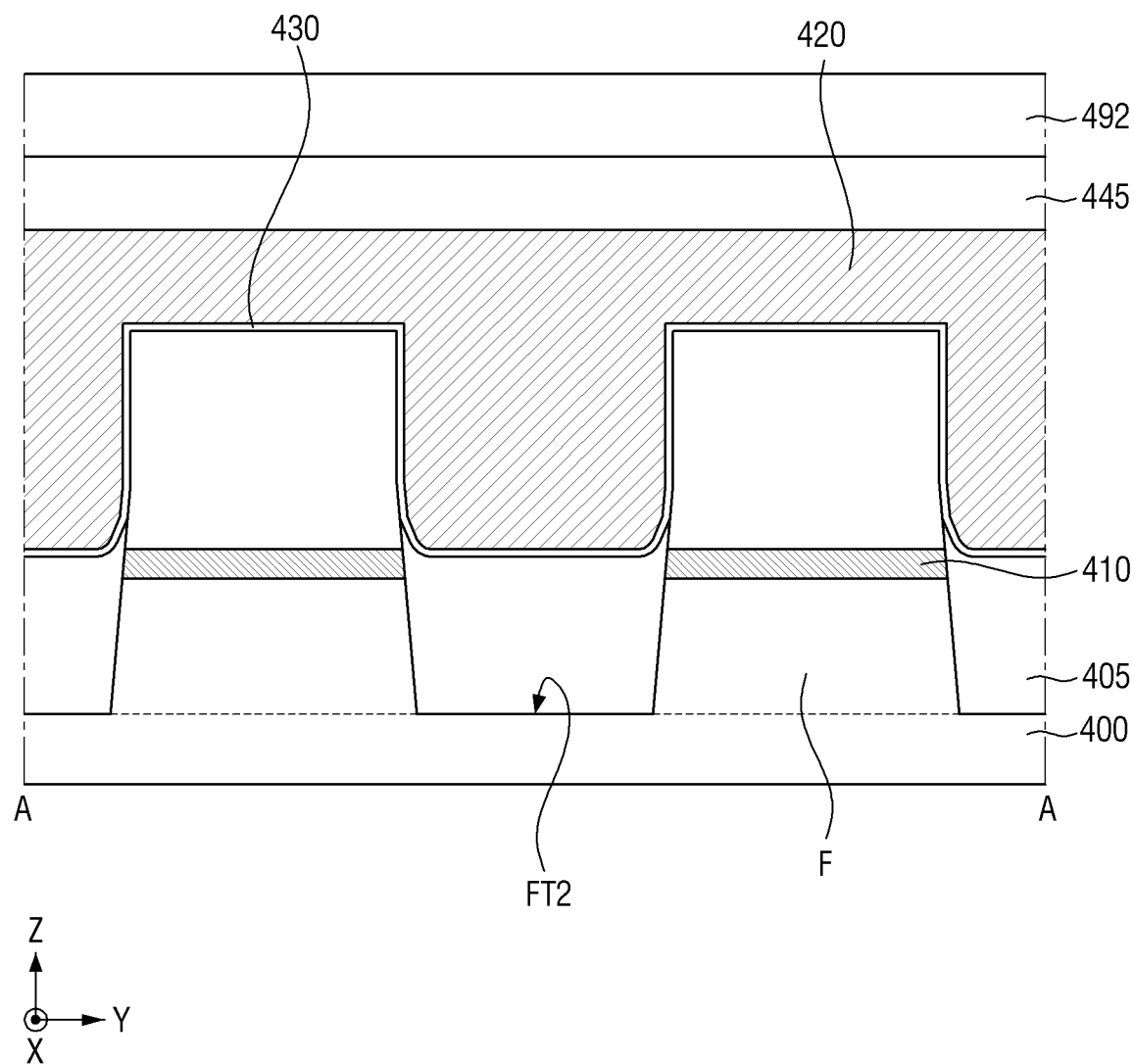
FIGS. 19 and 20 are exemplary cross-sectional views for explaining a semiconductor device according to some embodiments taken along A-A and B-B of FIG. 18, respectively.
Figure 20:
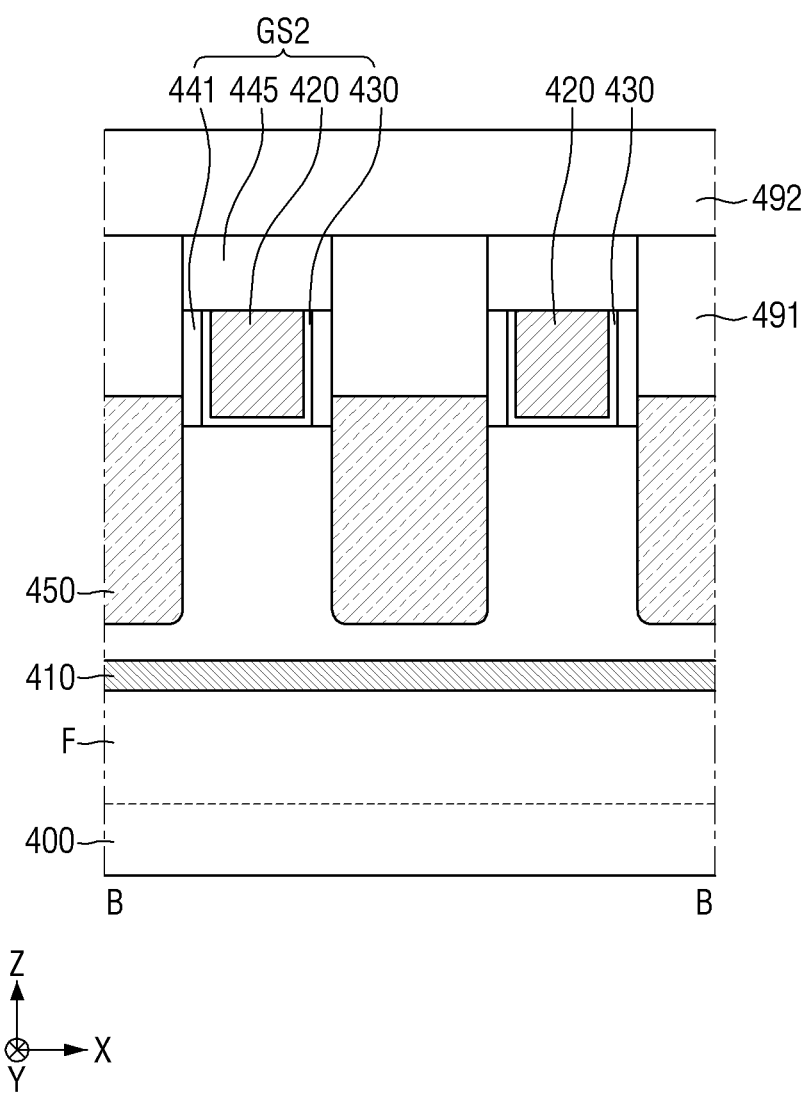
Figure 21:
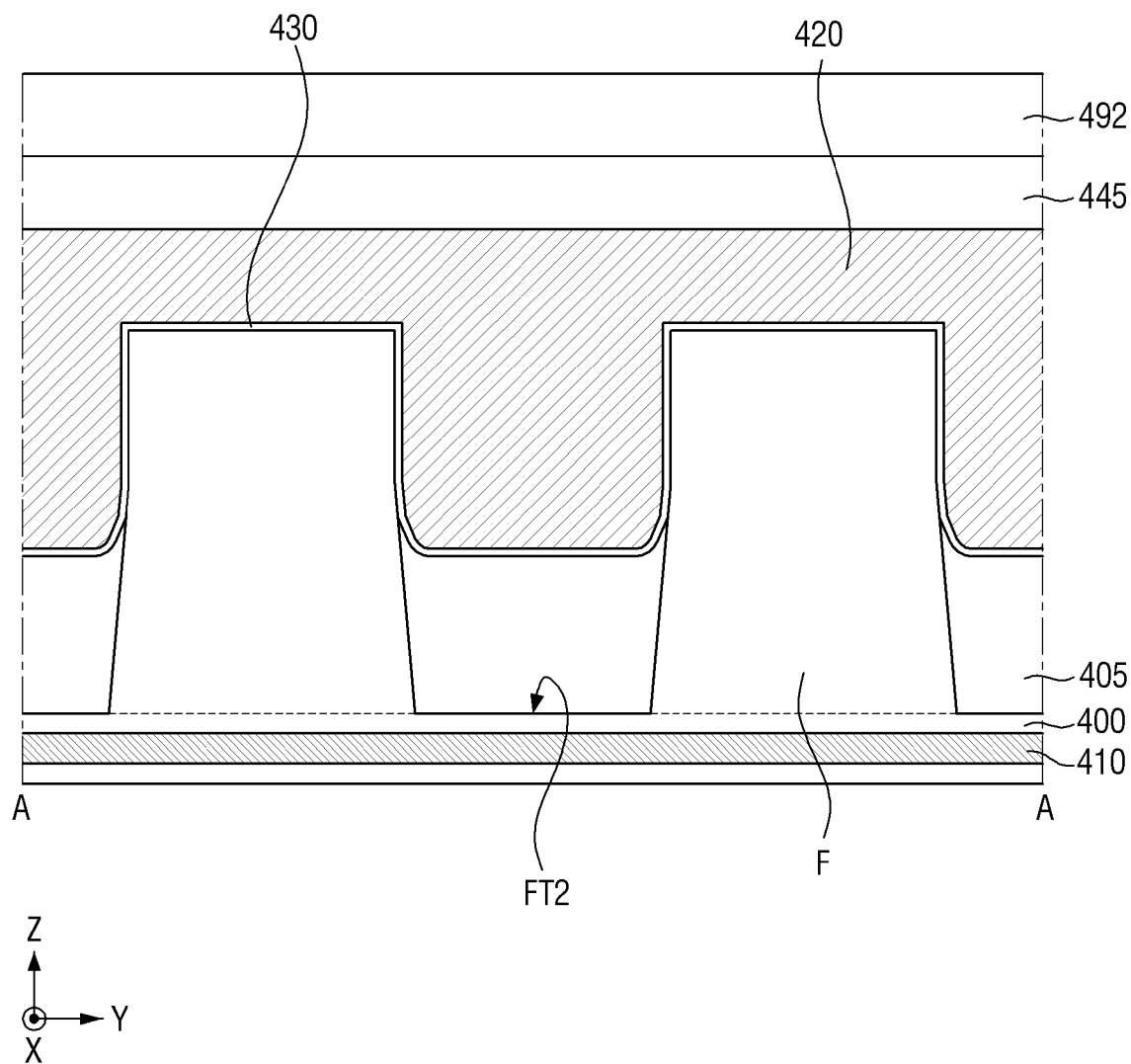
FIGS. 21 to 23 are exemplary cross-sectional views for explaining a semiconductor device according to some embodiments.
Figure 22:
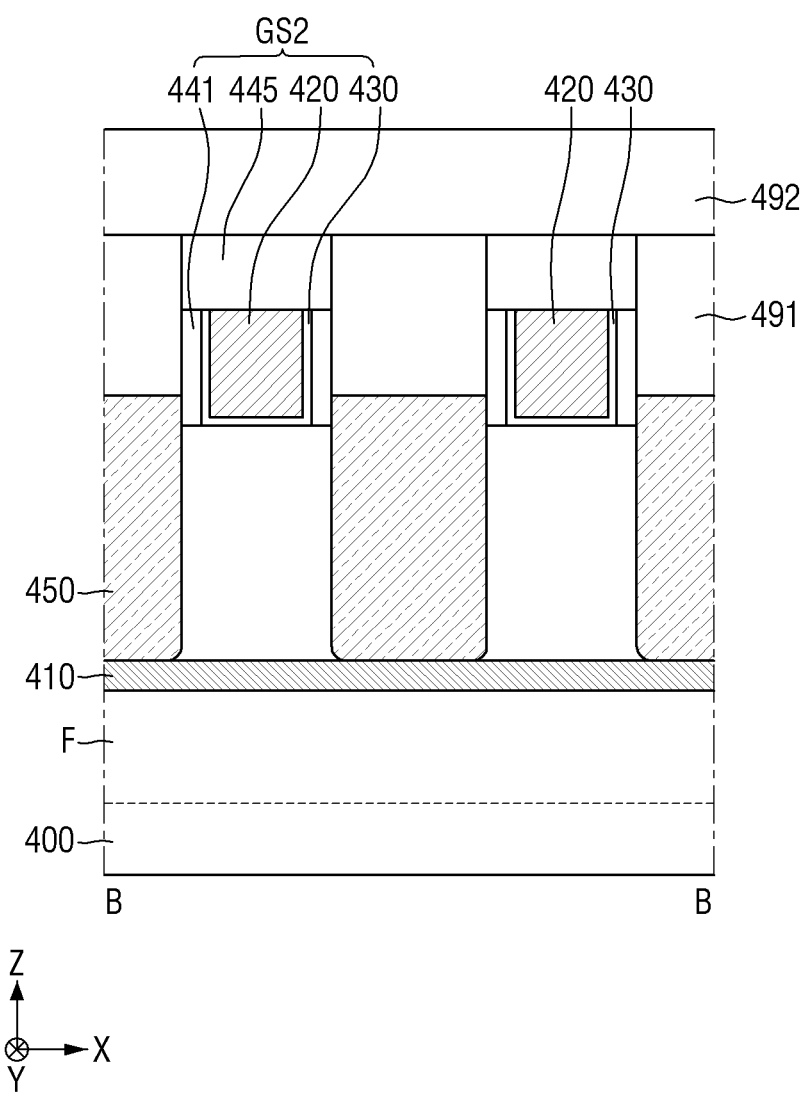
Figure 23:
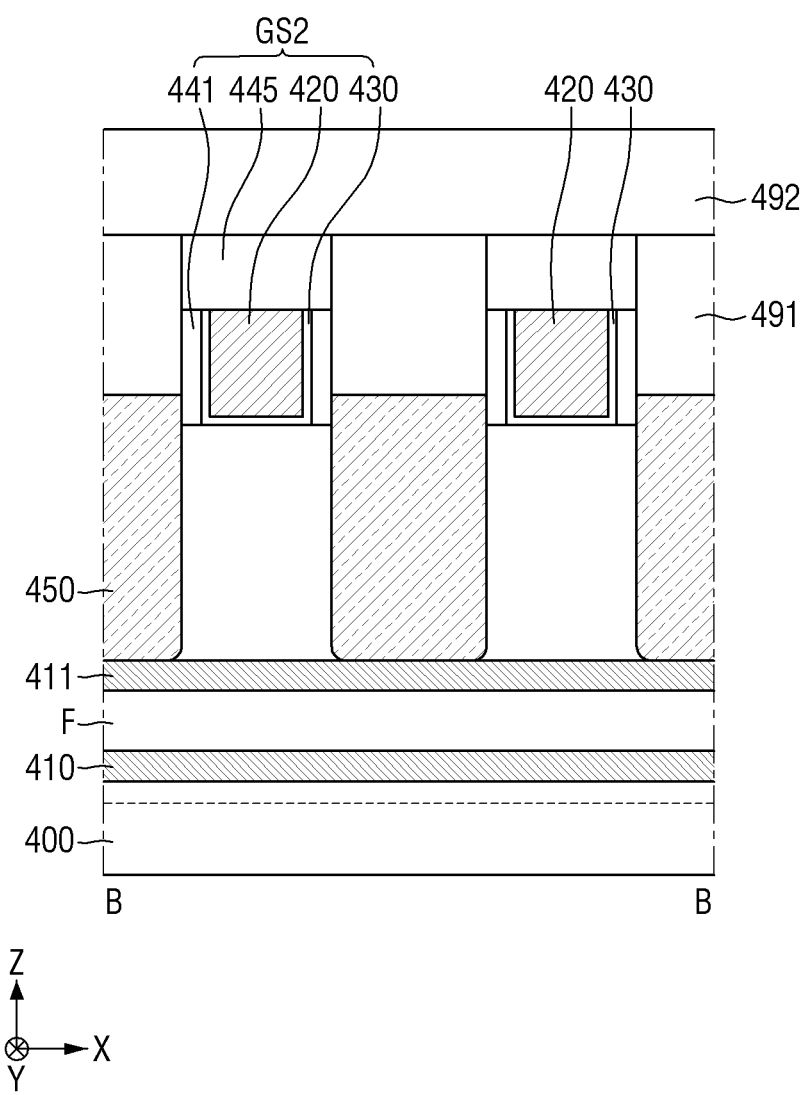

FIG. 18 is a layout diagram for explaining a semiconductor device according to some embodiments. FIGS. 19 and 20 are exemplary cross-sectional views for explaining a semiconductor device according to some embodiments taken along A-A and B-B of FIG. 18, respectively. FIGS. 21 to 23 are exemplary cross-sectional views for explaining a semiconductor device according to some embodiments.

For reference, FIG. 21 is a cross-sectional view taken along A-A of FIG. 18, and FIGS. 22 and 23 are cross-sectional views taken along B-B of FIG. 18.

Referring to FIGS. 18 to 23, the semiconductor device according to some embodiments may include a substrate 400, a first insulating film 410, a fin-shaped pattern F, a plurality of gate structures GS2, and an epitaxial pattern 450.

The substrate 400 may include a low-voltage operating region and a high-voltage operating region. More specifically, the low-voltage operating region may be, for example, but is not limited to, a logic region or an SRAM region. The high-voltage operating region may be, for example, but is not limited to, a I/O region.

The substrate 400 may be SOI (silicon-on-insulator). The substrate 400 may include a semiconductor material.

For example, the substrate 400 may include silicon (Si). An upper side of the substrate 400 may have a (100) crystal plane.

Fin-shaped patterns F may be placed on the substrate 400.

The fin-shaped patterns F may extend in the first direction X. The fin-shaped patterns F may be spaced in the second direction Y. The fin-shaped patterns F may protrude from the upper side of the substrate 400.

The fin-shaped patterns F may be separated by a fin trench FT2 extending in the first direction X.

The fin-shaped patterns F may include side walls that are opposite to each other. The side walls of the fin-shaped patterns F may extend in the first direction X. The side walls of the fin-shaped patterns F may be defined by the fin trench FT2.

The first insulating film 410 may be in the fin-shaped pattern F or the substrate 400. For example, as shown in FIG. 19, the first insulating film 410 may be in the fin-shaped pattern F. As another example, as shown in FIG. 21, the first insulating film 410 may be in the substrate 400.

The first insulating film 410 may correspond to the first insulating film 110 of FIG. 3.

The first insulating film 410 may include a crystalline insulating material. For example, the first insulating film 410 may include at least one of fluoride, oxide and oxyfluoride.

Specifically, fluoride may include at least one of aluminum fluoride ($AlF_x$; where x is a positive integer of 3 or less), calcium fluoride ($CaF_x$; where x is a positive integer of 2 or less), strontium fluoride ($SrF_x$; where x is a positive integer of 2 or less), yttrium fluoride ($YF_x$; where x is a positive integer of 3 or less), and zirconium fluoride ($ZrF_x$; where x is a positive integer of 4 or less).

Oxides may include at least one of aluminum oxide ($Al_2O_x$, where x is a positive integer of 3 or less), beryllium oxide ($BeO_x$; where x is a positive integer of 1 or less), calcium zirconium oxide ($Ca_xZr_{(1-x)}O_y$; where x is a positive integer greater of 0 or more and 1 or less, and y is a positive integer of 2 or less), hafnium oxide ($HfO_x$; where x is a positive integer of 2 or less), and yttrium oxide ($Y_2O_x$; where x is a positive integer of 3 or less).

Oxyfluoride may include at least one of lanthanum oxyfluoride ($LaO_xF_y$; where x is a positive integer of 1 or less, and y is a positive integer of 1 or less), lutetium oxyfluoride ($LuO_xF_y$; where x is a positive integer of 1 or less, and y is a positive integer of 1 or less), and yttrium oxyfluoride ($YO_xF_y$; where x is a positive integer of 1 or less, and y is a positive integer of 1 or less).

A thickness of the first insulating film 410 may be from about 1 nm to about 1,000 nm.

A difference between the lattice constant of the semiconductor material of the substrate 400 and the lattice constant of the crystalline insulating material of the first insulating film 410 may be smaller than 7%.

The thickness of the fin-shaped pattern F on the first insulating film 410 may be from about 1 nm to about 100 nm.

As shown in FIG. 20, the first insulating film 410 may not be in contact with the epitaxial pattern 450. That is, the semiconductor device according to some embodiments may have a partially depleted silicon on insulator (PDSOI) structure.

However, this is only an example, and the technical idea of the present invention is not limited thereto. For example, as shown in FIG. 22, the first insulating film 410 may come into contact with the epitaxial pattern 450. That is, the semiconductor device according to some embodiments may have a fully depleted silicon on insulator (FDSOI) structure.

Although the number of first insulating films 410 is shown as one in FIGS. 19 to 22, this is only an example, and the technical idea of the present invention is not limited thereto.

For example, as shown in FIG. 23, the semiconductor device according to some embodiments may further include a second insulating film 411.

The second insulating film 411 may be in the fin-shaped pattern F. The second insulating film 411 may be spaced apart from the first insulating film 410.

The second insulating film 411 may correspond to the second insulating film 111 shown in FIG. 8.

The second insulating film 411 may include a crystalline insulating material. For example, the second insulating film 411 may include at least one of fluoride, oxide and oxyfluoride.

The thickness of the second insulating film 411 may be from about 1 nm to about 1,000 nm.

The second insulating film 411 may come into contact with the epitaxial pattern 450. That is, the semiconductor device according to some embodiments may have a fully depleted silicon on insulator (FDSOI) structure.

However, this is only an example, and the technical idea of the present invention is not limited thereto. For example, although not shown, it is a matter of course that the second insulating film 411 does not come into contact with the epitaxial pattern 450.

The field insulating film 405 may be formed on the substrate 400. The field insulating film 405 may fill at least a part of the fin trench FT2.

The field insulating film 405 may wrap at least a part of the side walls of the fin-shaped pattern F. The fin-shaped pattern F may be defined by the field insulating film 405.

The field insulating film 405 may include, for example, an oxide film, a nitride film, an oxynitride film or a combination thereof.

A plurality of gate structures GS2 may be placed on the substrate 400. Each gate structure GS2 may extend in the second direction Y. Adjacent gate structures GS2 may be spaced apart from each other in the first direction X.

The gate structure GS2 may be placed on the fin-shaped pattern F. The gate structure GS2 may intersect the fin-shaped pattern F. The gate structure GS2 may wrap the fin-shaped pattern F.

The gate structure GS2 may include, for example, a gate electrode 420, a gate insulating film 430, an outer spacer 441, and a gate capping pattern 445.

The plurality of gate electrodes 420 may be placed on the substrate 400. The gate electrode 420 may be placed on the fin-shaped pattern F.

Each gate electrode 420 may extend in a second direction Y that intersects the first direction X. Each gate electrode 420 may be spaced apart in the first direction X.

The gate electrode 420 may be placed on a gate insulating film 430 to be described later. Each gate electrode 420 may intersect the fin-shaped pattern F. Each gate electrode 420 may wrap the fin-shaped pattern F.

The gate electrode 420 may include at least one of a metal, a metal alloy, a conductive metal nitride, a metal silicide, a doped semiconductor material, a conductive metal oxide and a conductive metal oxynitride. The gate electrode 420 may include, for example, but is not limited to, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and combinations thereof. Conductive metal oxides and conductive metal oxynitrides may include, but are not limited to, oxidized forms of the above-mentioned materials.

Although the number of gate electrodes 420 is shown as two, this is only for convenience, and the number is not limited thereto. The number of gate electrodes 420 may be larger than or smaller than two.

The gate insulating film 430 may wrap a part of the side walls of the fin-shaped pattern F.

The gate insulating film 430 may be placed on the substrate 400. The gate insulating film 430 may extend along the upper side of the fin-shaped pattern F and the upper side of the field insulating film 405. The gate insulating film 430 may wrap the gate electrode 420.

The gate insulating film 430 may be placed along the upper side of the fin-shaped pattern F and the inner side wall of the outer spacer 441.

The gate insulating film 430 may include an insulating material, for example, a silicon oxide, silicon oxynitride, silicon nitride or a high dielectric constant material having a higher dielectric constant than silicon oxide.

The outer spacer 441 may be placed on the side walls of the gate electrode 420. The outer spacer 441 may extend in the second direction Y. A pair of outer spacers 441 may be formed on the side walls of the gate electrode 420.

The outer spacer 441 may include, for example, at least one of silicon nitride (SiN), silicon oxynitride (SiON), silicon oxide ($SiO_2$), silicon oxycarbonitride (SiOCN), silicon boronitride (SiBN), silicon oxyboronitride (SiOBN), silicon oxycarbide (SiOC), and combinations thereof.

The gate capping pattern 445 may be placed on the gate electrode 420, the gate insulating film 430 and the outer spacer 441.

The gate capping pattern 445 may include, for example, at least one silicon nitride (SiN), silicon oxynitride (SiON), silicon oxide ($SiO_2$), silicon carbonitride (SiCN), silicon oxycarbonitride (SiOCN), and combinations thereof.

The plurality of epitaxial patterns 450 may be included in a source/drain of a transistor that uses the fin-shaped pattern F as the channel region.

The plurality of epitaxial patterns 450 may be placed between the fin-shaped patterns F. The plurality of epitaxial patterns 450 may be placed between the gate electrodes 420 adjacent to each other in the first direction X. Each epitaxial pattern 450 may be connected to the fin-shaped pattern F adjacent in the first direction X. The epitaxial pattern 450 may be formed to be adjacent to one side face of the fin-shaped pattern F and the other side face of the fin-shaped pattern F.

Although not shown, a source/drain contact may be placed on the plurality of epitaxial patterns 450. Further, a metal silicide film may be further placed between the source/drain contact and the epitaxial pattern 450.

A first interlayer insulating film 491 may cover the side walls of the outer spacer 441 and the gate capping pattern 445. The first interlayer insulating film 491 may be placed on the epitaxial pattern 450.

The second interlayer insulating film 492 may be placed on the first interlayer insulating film 491 and the gate capping pattern 445.

The first interlayer insulating film 491 and the second interlayer insulating film 492 may each include, for example, but are not limited to, FOX (Flowable Oxide), TOSZ (Tonen SilaZene), USG (Undoped Silica Glass), BSG (Borosilica Glass), PSG (PhosphoSilica Glass), BPSG (BoroPhosphoSilica Glass), PETEOS (Plasma Enhanced Tetra Ethyl Ortho Silicate), FSG (Fluoride Silicate Glass), CDO (Carbon Doped silicon Oxide), Xerogel, Aerogel, Amorphous Fluorinated Carbon, OSG (Organo Silicate Glass), Parylene, BCB (bis-benzocyclobutenes), SiLK, polyimide, porous polymeric material or a combination thereof.

Figure 24:
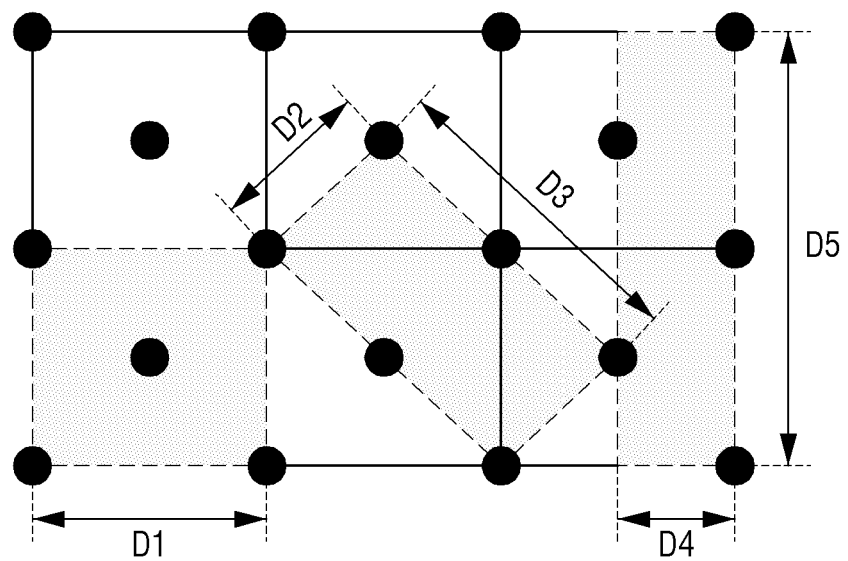
FIG. 24 is a diagram for explaining the meaning of the lattice constant in the semiconductor device according to some embodiments.

FIG. 24 is a diagram for explaining the meaning of the lattice constant in the semiconductor device according to some embodiments.

For reference, FIG. 24 shows an example of a possible reference lattice in (100) plane of silicon. Specifically, silicon may be an ingredient of the base substrates 100 and 200 of FIGS. 3, 7, 8, and 9 to 11, and the substrates 300 and 400 of FIGS. 13 to 17, and 19 to 23.

Referring to FIGS. 3 and 24, the base substrate 100 may include a semiconductor material, and the insulating film 110 may include a crystalline insulating material. For example, the base substrate 100 may include silicon.

The lattice constant along (100) plane of silicon may be a first distance D1. The first distance may be about 5.43 Å.

In the semiconductor device according to some embodiments, the difference between the lattice constant of silicon and the lattice constant of the crystalline insulating material may be smaller than 7%. That is, the difference between the first distance D1 and the lattice constant of the crystalline insulating material may be smaller than 7%.

However, the meaning of the lattice constant is merely an example, and the technical idea of the present invention is not limited thereto. In the present invention, the meaning of the lattice constant may be expanded and interpreted.

As an example, on the (100) plane of silicon, the lattice constant may be measured differently depending on the direction. Specifically, the lattice constant may be measured in the directions of the second, third, and fifth distances D2, D3 and D5, unlike the direction of the first distance D1.

As another example, on the (100) plane of silicon, the lattice constant may be measured differently depending on the multiple. Specifically, the first distance D1 is the shortest distance from one particle to the next adjacent particle in the direction of the first distance D1. On the other hand, the third distance D3 and the fifth distance D5 are the shortest distances from one particle to the second adjacent particle in each direction. Also, the fourth distance D4 is half the shortest distance from one particle to the next adjacent particle in the direction of the fourth distance D4.

Therefore, the lattice constant along the (100) plane of silicon may be from the second distance D2 to the fifth distance D5.

In the semiconductor device according to some embodiments, the difference between the lattice constant of silicon and the lattice constant of the crystalline insulating material may be smaller than 7%. That is, the difference between one of the second to fifth distances D2 to D5 and the lattice constant of the crystalline insulating material may be smaller than 7%.

In concluding the detailed description, those skilled in the art will appreciate that many variations and modifications may be made to the example embodiments without substantially departing from the scope of the present invention. Therefore, the disclosed example embodiments of the invention are used in a generic and descriptive sense only and not for purposes of limitation.

What is claimed is:

1. A semiconductor device comprising:
   a base substrate comprising a semiconductor material;
   an insulating film on the base substrate; and
   an upper substrate on the insulating film,
   wherein the insulating film comprises a crystalline insulating material,
   wherein a difference between a lattice constant of the semiconductor material and a lattice constant of the crystalline insulating material is smaller than 7%,
   wherein the insulating film has a thickness of about 1 nm to about 1,000 nm, and
   wherein the upper substrate has a thickness of about 1 nm to about 100 nm.

2. The semiconductor device of claim 1, wherein the insulating film comprises at least one of fluoride, oxide and oxyfluoride.

3. The semiconductor device of claim 2, wherein the fluoride comprises at least one of aluminum fluoride, calcium fluoride, strontium fluoride, yttrium fluoride, and zirconium fluoride.

4. The semiconductor device of claim 2, wherein the oxide comprises at least one of aluminum oxide, beryllium oxide, calcium zirconium oxide, hafnium oxide and yttrium oxide.

5. The semiconductor device of claim 2, wherein the oxyfluoride comprises at least one of lanthanum oxyfluoride, lutetium oxyfluoride, and yttrium oxyfluoride.

6. The semiconductor device of claim 1, wherein the insulating film contacts an upper side of the base substrate, and
   wherein the upper side of the base substrate has a (100) crystal plane.

7. The semiconductor device of claim 1, wherein the base substrate and the insulating film contact each other, and
   wherein the insulating film and the upper substrate contact each other.

8. The semiconductor device of claim 1, further comprising:
   a gate electrode on the upper substrate;
   spacers on opposite side walls of the gate electrode; and
   a source/drain region in the upper substrate and not overlapped by the gate electrode.

9. The semiconductor device of claim 8, wherein the source/drain region contacts the insulating film.

10. A semiconductor device comprising:
    a base substrate;
    a first insulating film on the base substrate;
    a first upper substrate on the first insulating film;
    a second insulating film on the first upper substrate;
    a second upper substrate on the second insulating film;
    a gate electrode on the second upper substrate;
    spacers on opposite side walls of the gate electrode; and
    a source/drain region in the second upper substrate and not overlapped by the gate electrode,
    wherein the source/drain region contacts the second insulating film,
    wherein the first insulating film and the second insulating film comprise a crystalline insulating material,
    wherein the first insulating film and the second insulating film each have a thickness of about 1 nm to about 1,000 nm, and
    wherein the first upper substrate and the second upper substrate each have a thickness of about 1 nm to about 100 nm.

11. The semiconductor device of claim 10, wherein the first insulating film and the second insulating film comprise at least one of fluoride, oxide, and oxyfluoride.

12. The semiconductor device of claim 10, wherein the base substrate comprises a semiconductor material, and
    wherein a difference between a lattice constant of the semiconductor material and a lattice constant of the crystalline insulating material is smaller than 7%.

13. A semiconductor device comprising:
a substrate comprising a lower substrate, and a lower pattern extending in a first direction on the lower substrate;
a first insulating film in the substrate;
a sheet pattern on the lower pattern and spaced apart from the lower pattern;
a gate electrode on the lower pattern, wherein the gate electrode extends in a second direction different from the first direction and wraps around the sheet pattern,
wherein the first insulating film comprises a crystalline insulating material,
wherein the first insulating film has a thickness of about 1 nm to about 1,000 nm, and
wherein the lower pattern has a thickness of about 1 nm to about 100 nm.

14. The semiconductor device of claim 13, wherein the first insulating film comprises at least one of fluoride, oxide and oxyfluoride.

15. The semiconductor device of claim 14, wherein the fluoride comprises at least one of aluminum fluoride, calcium fluoride, strontium fluoride, yttrium fluoride and zirconium fluoride,
wherein the oxide comprises at least one of aluminum oxide, beryllium oxide, calcium zirconium oxide, hafnium oxide, and yttrium oxide, and
wherein the oxyfluoride comprises at least one of lanthanum oxyfluoride, lutetium oxyfluoride, and yttrium oxyfluoride.

16. The semiconductor device of claim 13, wherein the substrate comprises a semiconductor material, and
wherein a difference between a lattice constant of the semiconductor material and a lattice constant of the crystalline insulating material is smaller than 7%.

17. The semiconductor device of claim 13, further comprising:
an epitaxial pattern on the lower pattern and between adjacent gate electrodes along the first direction,
wherein the epitaxial pattern is in contact with the first insulating film.

18. The semiconductor device of claim 13, further comprising:
a second insulating film in the substrate and spaced apart from the first insulating film,
wherein the second insulating film has a thickness of from about 1 nm to about 1,000 nm, wherein the second insulating film comprises at least one of fluoride, oxide and oxyfluoride.

* * * * *